(12) United States Patent
Kawamura et al.

(10) Patent No.: US 7,354,625 B2
(45) Date of Patent: Apr. 8, 2008

(54) GAS BARRIER FILM

(75) Inventors: Koichi Kawamura, Shizouka-ken (JP); Takeyoshi Kano, Shizouka-ken (JP); Miki Takahashi, Shizouka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/366,381

(22) Filed: Feb. 14, 2003

(65) Prior Publication Data
US 2003/0157346 A1 Aug. 21, 2003

(30) Foreign Application Priority Data

Feb. 14, 2002 (JP) .............................. 2002-036676
Aug. 22, 2002 (JP) .............................. 2002-241739

(51) Int. Cl.
*B05D 3/06* (2006.01)
(52) U.S. Cl. .................. 427/419.1; 427/532; 427/569; 428/483
(58) Field of Classification Search ..... 428/457–472.3, 428/483; 427/498, 512, 582, 484, 419.1, 427/488, 491, 532–540, 569
See application file for complete search history.

(56) References Cited

U.S. PATENT DOCUMENTS

| 3,686,018 A * | 8/1972 | Lindblom et al. ........... 427/537 |
| 4,897,305 A * | 1/1990 | Ho .............................. 428/333 |
| 5,552,226 A * | 9/1996 | Thurm et al. ................. 428/412 |
| 5,725,962 A * | 3/1998 | Bader et al. ................. 428/515 |
| 5,849,366 A * | 12/1998 | Plester ........................ 427/491 |
| 5,981,079 A * | 11/1999 | Mount et al. ................ 428/461 |
| 6,214,422 B1 * | 4/2001 | Yializis ....................... 427/488 |
| 6,395,209 B2 * | 5/2002 | Yoshida et al. ............. 264/137 |
| 6,420,041 B1 * | 7/2002 | Amon et al. ................. 428/461 |
| 6,426,125 B1 * | 7/2002 | Yang et al. .................. 427/488 |
| 6,503,635 B1 * | 1/2003 | Kong et al. ................. 428/461 |
| 2003/0157346 A1 * | 8/2003 | Kawamura et al. ......... 428/451 |
| 2004/0241454 A1 * | 12/2004 | Shaw et al. .............. 428/425.5 |

FOREIGN PATENT DOCUMENTS

| EP | 0 574 352 | * 12/1993 |
| EP | 0 622 399 A1 | 11/1994 |
| FR | 1485291 | * 7/1965 |
| JP | 50-115277 A | 9/1975 |
| JP | 52-145476 A | 12/1977 |
| JP | 56-5416 B2 | 2/1981 |
| JP | 62104399 | * 4/1987 |
| JP | 10-29264 A | 2/1998 |
| JP | 2000-25179 A | 1/2000 |
| JP | 2000-198173 A | 7/2000 |
| JP | 2001-199016 A | 7/2001 |
| JP | 2001-287294 A | 10/2001 |
| WO | WO 01/34313 A2 | 5/2001 |

OTHER PUBLICATIONS

Japanese Abstract No. 01294244, dated Nov. 28, 1999.
Japanese Abstract No. 2000025179, dated Jan. 25, 2000.

* cited by examiner

*Primary Examiner*—D. Lawrence Tarazano
(74) *Attorney, Agent, or Firm*—Sughrue Mion, PLLC

(57) ABSTRACT

The invention provides a gas barrier film having a support including a hydrophilic surface or a non-ionic hydrophobic surface on which a graft polymer chain having a polar group is present, and an inorganic thin film formed on the surface.

8 Claims, No Drawings

GAS BARRIER FILM

BACKGROUND OF THE INVENTION

1. Field of the Invention

The present invention relates to a gas barrier film that is suitable for a packaging material, which requires air-tightness and oxygen barrier properties, to be used for foods, medical drugs, electronic parts and the like.

2. Description of the Related Art

Heretofore, a polypropylene film excellent in water vapor barrier properties has been used as a transparent gas barrier film for packaging, and especially when high oxygen barrier properties are required, the polypropylene film is subjected to various kinds of surface processing. Examples of the surface processing include the following methods: (1) a resin having relatively high gas barrier properties, such as polyvinylidene chloride, polyvinyl alcohol or an ethylene/vinyl alcohol copolymer, is coated on a surface of the polypropylene film, or alternatively, a film of the resin having relatively high gas barrier properties is laminated on the polyethylene film to form a multilayer structure including the resin film and the polypropylene film; (2) an aluminum foil is laminated on the surface of the polypropylene film, or alternatively, aluminum is vacuum-deposited to form a metallic thin film on the polypropylene film; and (3) an inorganic compound (e.g., metallic oxides such as aluminum oxide, and silicon oxide) is vapor-deposited on the surface of the polypropylene film to form a thin film of the inorganic compound.

A polypropylene film having undergone the surface processing (1) can be versatilely used due to transparency, processing suitability and cost thereof. However, the gas barrier film obtained by coating polyvinylidene chloride on the polypropylene film in the surface processing (1) has a problem in that a hydrogen chloride gas is generated when the film is disposed of by burning causing a damage to an incinerator and, under some burning conditions, possibly leading to environmental pollution. Although the film obtained by the surface processing (1) by coating polyvinyl alcohol or an ethylene-vinyl alcohol copolymer does not pose a problem associated with burning, the film is insufficient in gas barrier properties with respect to oxygen and water vapor under conditions of high temperature and high humidity owing to the hygroscopic nature thereof, and accordingly, its applicability is limited.

A polypropylene film having undergone the surface processing (2) is excellent in appearance and gas barrier properties with respect to water vapor and oxygen, although the film is lacking with respect to visibility of contents. However, this gas barrier film does not transmit microwaves and hence cannot be used in a microwave oven. Furthermore, this film has problems in that the aluminum foil accounts for a large proportion of production costs of the packaging material, and aluminum remains as a mass after the film is burnt. Furthermore, when the aluminum foil is used, due to a thickness of several tens of micrometers that is required for excellent gas barrier properties, a heaviness of the film makes it unsuitable for use as a packaging material.

A polypropylene film having undergone the surface processing (3) has been widely used in recent years owing to its transparency and light weight. Such a film that is obtained by simply vapor-depositing an inorganic compound (e.g., metallic oxides such as aluminum oxide, and silicon oxide) on the surface of a polypropylene film preferably has an increased thickness to achieve sufficient oxygen barrier properties. However, the film having increased thickness has problems of poor flexibility, a tendency to develop color leading to opaqueness, and higher film forming costs. Furthermore, there may arise many problematic cases where adhesion between the polypropylene film and the inorganic compound thin film is insufficient causing peeling of the inorganic compound thin film or generation of cracks, thereby resulting in deteriorated gas barrier properties.

SUMMARY OF THE INVENTION

Considering the problems of the prior art described above, it is an object of the present invention to provide a gas barrier film that exhibits good and long-lasting adhesion between a film and an inorganic compound thin film, and moreover is excellent in transparency, visibility and gas barrier properties.

The inventors have conducted intensive research on a graft polymer and a support having the graft polymer on a surface thereof, specifically focusing on strong ionic adsorbability of the graft polymer, and have found that by using a support including a hydrophilic surface or a non-ionic hydrophobic surface on which a graft polymer chain having a polar group is present, the above described problems can be solved, to thereby accomplish the invention.

The gas barrier film of the invention is characterized in that it comprises a support including a hydrophilic surface or a non-ionic hydrophobic surface on which a graft polymer chain having a polar group is present, and an inorganic thin film formed on the surface.

Examples of the polar group usable in the invention include a hydrophilic group and a non-ionic polar group. Specific examples of the non-ionic polar group include a hydrophobic polar group containing a hetero atom in its structure, such as a pyridyl group.

It is preferable that an inorganic material to form the inorganic thin film is a metal or a metallic oxide. It is also preferable that formation of the inorganic thin film is conducted employing a gas phase method. It is further preferable that formation of the inorganic thin film is carried out employing a fine particle adsorption method.

The present invention also provides a method of producing a gas barrier film that has excellent gas barrier properties. An embodiment of the method of producing a gas barrier film comprises the steps of: preparing a substrate; allowing to react the substrate with a hydrophilic graft polymer having at a terminal end or in a side chain thereof a functional group that is capable of reacting with the substrate to form a hydrophilic graft polymer layer; and forming an inorganic thin film on the formed hydrophilic graft polymer layer by a gas phase method using an inorganic compound or by an inorganic fine particle adsorption method.

Another embodiment of the method of producing a gas barrier film of the invention comprises the steps of: preparing a substrate; applying energy to the surface of the substrate by plasma irradiation, light irradiation or heating to provide active species on the surface of the substrate; contacting the substrate having the active species on the surface thereof with a compound having a hydrophilic functional group and a double bond in a molecule to polymerize the active species to the compound and to thereby form a hydrophilic graft polymer; and forming an inorganic thin film on the formed hydrophilic graft polymer layer by a gas phase method using an inorganic compound or by an inorganic fine particle adsorption method.

Although the functional mechanism of the present invention is not elucidated, the following is conjectured. The support of the gas barrier film of the invention includes a surface on which a graft polymer chain having a polar group is present, and hence, if the inorganic material (e.g., aluminum oxide) is provided on such a surface, the inorganic material is firmly adsorbed to the surface owing to a polarity interaction generated by the polar group that is present in the graft polymer chain having the polar group, whereby a uniform and dense film is produced in a graft layer. As a result, increased wear-resistance can be obtained, even when the produced layer is thin, which provides high durability. Furthermore, the inorganic thin film, particularly when obtained through a gas phase method, has an advantage of excellent transparency because the inorganic thin layer having high adhesiveness can be formed without providing an intermediate layer containing a binder or the like.

DESCRIPTION OF THE INVENTION

The invention will be described in detail below.

A gas barrier film of the invention contains a support including, on at least one surface thereof, a surface on which a graft polymer chain having a polar group is present, and an inorganic thin film formed on the surface.

Examples of the polar group usable in the invention include a hydrophilic group and a non-ionic polar group.

First, one embodiment using a support including a surface on which a graft polymer chain whose polar group is a hydrophilic group is used will be explained.

Support Including Hydrophilic Surface on which Hydrophilic Graft Polymer Chain is Present The hydrophilic surface of the support as used herein refers to the surface on which a hydrophilic graft polymer chain is present. The hydrophilic graft polymer chain may be bonded directly to the surface of the support. Alternatively, an interlayer to which the graft polymer is likely to bind is disposed on the surface of the support so that the hydrophilic polymer is grafted onto the interlayer.

The hydrophilic surface of the support used in the invention involves a feature in which a polymer with the hydrophilic graft polymer chain grafted onto the backbone polymer is coated on the surface of the support, or a polymer with the hydrophilic graft polymer chain grafted onto the backbone polymer and additionally having a crosslinkable functional group introduced thereto is coated on the surface of the support, and crosslinking is further performed after the coating. Alternatively, a composition containing a hydrophilic polymer carrying a terminal crosslinkable group and a crosslinking agent is coated on the surface of the support, and crosslinking is further performed after the coating.

The hydrophilic graft polymer for use in the invention is characterized in that one end of the polymer is bonded to the surface of the support or to the surface layer of the support and in that the graft portion exhibiting hydrophilicity has substantially un-crosslinked. Because of this structure, mobility of the polymer at the portion exhibiting hydrophilicity is not restricted; or the polymer at this portion can maintain high motility without being buried in a tightly crosslinked structure. For this reason, it is thought that the hydrophilic graft polymer exhibiting good hydrophilicity and adsorbability with respect to metals and metal particles, as compared with a hydrophilic polymer having an ordinary crosslinked structure.

The molecular weight (Mw) of the hydrophilic graft polymer chain is 500 to 5,000,000, preferably of 1000 to 1,000,000, and more preferably of 2000 to 500,000.

As used herein, (a) the structure in which the hydrophilic graft polymer chain is bonded directly to the surface of the support or to the interlayer provided on the surface of the support is referred to as "surface graft", and (b) the structure in which the hydrophilic graft polymer chain is introduced into the crosslinked polymer layer is referred to as "crosslinked layer to which graft chains are introduced". Further, as used herein, the support or the support provided with an interlayer may occasionally be referred to as "substrate".

(a) Method for Producing Surface Graft

A surface having hydrophilic groups of the graft polymer may be formed on the substrate mainly by two methods: one is a method in which the graft polymer is linked to the substrate via chemical bonding (a-1); and the other is a method in which a compound having a polymerizable double bond is allowed to polymerize at the starting point on the substrate to form a graft polymer (a-2).

<(a-1): Method in which the Graft Polymer is Linked to the Substrate Via Chemical Bonding>

First, a method of bonding a graft polymer to the substrate via chemical bonding is described.

In this method, a polymer having at the terminal or the side chain thereof a functional group is used to cause a chemical reaction between this functional group and the functional group on the surface of the substrate to make the polymer grafted on the substrate. By this method, the graft polymer may be bonded to the substrate through a chemical reaction. The functional group which is reactive to the substrate is not particularly limited so long as it is reactive to the functional group on the surface of the substrate. Examples of the functional group include a silane coupling group such as alkoxysilane, an isocyanate group, an amino group, a hydroxyl group, a carboxyl group, a sulfonic acid group, a phosphoric acid group, an epoxy group, an allyl group, a methacryloyl group and an acryloyl group. Particularly useful compounds as the polymer having the functional group at the terminal or the side chain thereof include a hydrophilic polymer having a trialkoxysilyl group at the polymer terminal, a hydrophilic polymer having an amino group at the polymer terminal, a hydrophilic polymer having a carboxyl group at the polymer terminal, a hydrophilic polymer having an epoxy group at the polymer terminal, and a hydrophilic polymer having an isocyanate group at the polymer terminal.

The hydrophilic polymer for use in the invention is not particularly limited so long as it has hydrophilicity. Specific examples thereof include polyacrylic acid, polymethacrylic acid, polystyrene sulfonic acid, poly-2-acrylamide-2-methylpropane sulfonic acid and the salts thereof, polyacrylamide and polyvinyl acetamide. Additionally, the polymers synthesized from the hydrophilic monomer or the copolymers containing the hydrophilic monomer, used for surface graft polymerization described below, may be advantageously used.

<(a-2): Method in which a Compound Having a Polymerizable Double Bond is Allowed to Polymerize at the Starting Point on the Substrate to Form a Graft Polymer>

A graft polymer is generally produced by a method called surface graft polymerization in which a compound having a polymerizable double bond is allowed to polymerize from the starting point on the substrate (a support or a support provided with an intermediate layer). In this surface graft polymerization, active species are provided on the surface of the substrate by conducting plasma irradiation, light irradiation or heating to make the compound, having the polymerizable double bond and arranged to contact with the substrate, to bind to the substrate through polymerization. By this method, an end terminal of the thus produced graft polymer is fixed to the substrate surface.

Any known method described in literatures may be used for the surface graft polymerization in the invention. For example, as the surface graft polymerization, photo-graft polymerization and plasma-graft polymerization are described in *New Polymer Experimental Studies* 10 (edited by The Society of Polymers, Japan), 1994, published by Kyoritsu Shuppan Co., Ltd., p. 135. Further, radiation-graft polymerization using a γ-ray, an electron beam or the like is described in *Adsorption Technology Handbook*, supervised by Takeuchi, NTS Co., Ltd., issued in February 1999, p. 205 and p. 695. The methods disclosed in JP-A Nos. 63-92658, 10-296895, and 11-119413 may be used as specific examples of the photo-graft polymerization. As plasma-graft polymerization and radiation-graft polymerization, the methods described in the above literatures and the method described, for example, in Ikada et al., *Macromolecules*, Vol. 19, page 1804(1986) may be employed.

More specifically, the surface of a polymer such as PET is treated with a plasma or an electron beam so as to generate radicals on the surface and the resultant activated surface is allowed to react with a monomer having a hydrophilic functional group to produce a surface layer to which a graft polymer is bonded (a hydrophilic surface).

In addition to the disclosure contained in the above literatures, photo-graft polymerization can be carried out by a process which comprises coating on the surface of a film support a photo-polymerizable composition, contacting the thus obtained substrate with an aqueous radical-polymerizable compound and irradiating the layer with light as disclosed in JP-A No. 53-17407 (Kansai Paint Co., Ltd.) and JP-A No. 2000-212313 (Dainippon Ink and Chemicals, Incorporated).

The compound having a polymerizable double bond useful for forming a hydrophilic graft polymer chain is required to have the polymerizable double bond and to exhibit hydrophilicity. Any compound including a polymer, an oligomer or a monomer may be used for this purpose so long as it contains a double bond in the molecule. A particularly useful compound is the hydrophilic monomer.

Examples of the hydrophilic monomer usable in the invention include a monomer having positive charges, such as ammonium and phosphonium, or a monomer containing acidic groups having negative charges or capable of dissociating into negative charges, such as sulfonic acid groups, carboxyl groups, phoshoric acid groups and phosphonic acid groups. Additional hydrophilic monomers having a nonionic group such as a hydroxyl group, an amide group, a sulfonamide group, an alkoxy group, and a cyano group may be used.

Specific examples of the hydrophilic monomer usable in the invention include (meth)acrylic acid or the alkali metal salts and the amine salts thereof; itaconic acid or the alkali metal salts and the amine salts thereof; allylamine or the halogenated hydroacid salts thereof; 3-vinylpropionic acid or the alkali metal salts and the amine salts thereof; vinylsulfonic acid or the alkali metal salts and the amine salts thereof; styrene sulfonic acid or the alkali metal salts and the amine salts thereof; 2-sulfoethylene(meth)acrylate and 3-sulfopropylene (meth)acrylate or the alkali metal salts and the amine salts thereof; 2-acrylamide-2-methylpropane sulfonic acid or the alkali metal salts and the amine salts thereof; acid phosphooxypolyoxyethylene glycol mono (meth)acrylate or the salts thereof; 2-dimethylaminoethyl (meth)acrylate or the halogenated hydroacid thereof; 3-trimethylammonium-propyl(meth)acrylate; 3-trimethylammonium-propyl(meth)acrylamide; N,N,N-trimethyl-N-(2-hydroxy-3-methacryloyloxypropyl)ammonium chloride. Also usable as the hydrophilic monomer are 2-hydroxyethyl(meth)acrylate, (meth)acrylamide, N-monometylol(meth)acrylamide, N-dimethylol(meth) acrylamide, N-vinyl pyrrolidone, N-vinyl acetamide and polyoxyethyleneglycol mono(meth)acrylate.

(b) Method for Forming Crosslinked Layer to which Hydrophilic Graft Chain is Introduced The crosslinked hydrophilic layer to which the hydrophilic graft chains are introduced may be formed by synthesizing a graft polymer using a conventionally known method for producing a graft polymer, followed by crosslinking the resultant graft polymer. Synthesis of a graft polymer is described in "*Graft Polymerization and Its Application*" written by Humio Ide, edited by Publishing Association of Polymer and published in 1977 by Kyoritsu Publishing Co., and in "*New Experimental Polymer Science* vol. 2; *Synthesis and Reaction of Polymer*", edited by Polymer Science Association, Kyoritsu Publishing Co., 1995.

Basically, synthesis of the graft polymer may be divided into three methods: 1) polymerizing a branch monomer from a backbone polymer; 2) binding a branch polymer to a backbone polymer; and 3) copolymerizing a branch polymer to a backbone polymer ("macromer method"). While any methods described above may be employed for forming the hydrophilic surface according to the invention, the third method (macromer method) is excellent in view of suitability for production and control of the film structure. Synthesis of the graft polymer using the macromer is described in "*New Experimental Polymer Science*, vol. 2; *Synthesis and Reaction of Polymer*", edited by Polymer Science Association, Kyoritsu Publishing Co., 1995 described above. The method is also described in detail in Isamu Yamashita et al., "*Chemistry and Industry of Macromonomer*", I.P.C., 1989.

Specifically, a hydrophilic macromer can be synthesized through a known method using the aforementioned hydrophilic monomers, such as acrylic acid, acrylamide, 2-acrylamide-2-methylpropane sulfonic acid and N-vinyl acetamide, so as to form an organic crosslinked hydrophilic layer.

Examples of the hydrophilic macromer suitably used in the invention include a macromer derived from a carboxylic group-containing monomer such as acrylic acid and methacrylic acid; a sulfonic acid-type macromer derived from monomers of 2-acrylamide-2-methylpropane sulfonic acid and styrene sulfonic acid, and the salts thereof; an amide-type macromer such as acrylamide and methacrylamide; an amide-type macromer derived from N-vinylcarboxylic acid amide monomers such as N-vinylacetamide, N-vinylfolmamide; a macromer derived from a hydroxyl group-containing monomer such as hydroxyethyl methacrylate, hydroxyethyl acrylate and glycerol monomethacrylate; and a macromer derived from a alkoxy group or ethylene oxide group-containing monomer such as methoxyethyl acrylate, methoxypolyethyleneglycol acrylate and polyethyleneglycol acrylate. Monomers having a polyethyleneglycol chain or a polypropyleneglycol chain may also be used as the macromer for use in the invention.

The macromer usually has a molecular weight of 400 to 100,000, preferably of 1,000 to 50,000, and particularly preferably of 1,500 to 20,000. If the molecular weight is 400 or less, the effect exerted by the macromer cannot be expected. If the molecular weight is larger than 100,000, polymerization with a copolymer constituting the main chain may be impaired.

One method for forming the crosslinked layer to which the hydrophilic graft chains are introduced after synthesis of the hydrophilic macromer comprises the steps of copolymerizing the hydrophilic macromer with another monomer having another functional group to synthesize a graft copolymer, and coating on the support the resultant graft copolymer together with a crosslinking agent, that is reactive with the functional group in the polymer, to cause a reaction between the synthesized graft copolymer and the reactive functional groups to effect cross-linking by applying heat. Another method comprises the steps of synthesizing the hydrophilic macromer and a graft polymer having a group capable of photo-crosslinking or a polymerizable group, coating them onto the support to effect crosslinking by light irradiation.

As detailed in (a) and (b) above, the hydrophilic surface containing the hydrophilic graft polymer chain can be provided on the substrate. The thickness of the hydrophilic layer may be specified depending on the use purposes. Usually, the thickness is preferably 0.001 μm to 10 μm, more preferably 0.01 μm to 5 μm, and most preferably 0.1 μm to 2 μm. When the layer is too thin, scratch resistance may be impaired, while when the layer is too thick, adhesiveness is likely to be lowered.

Next, another embodiment using a support including a surface on which a graft polymer chain whose polar group is a non-ionic polar group is used will be explained.

As the non-ionic polar side chain in the graft polymer, a hydrophobic polar group containing a hetero atom may be used in the invention. As the hetero atom, nitrogen, sulfur and oxygen are preferable. Illustrative examples of the hydrophobic polar group containing the hetero atom include a hetero aromatic group containing nitrogen or sulfur such as a pyridine group, a quinoline group, a thiophene group or a benzothiophene group; an amino group such as a dimethylamino group or a diethylamino group; an ether group or a thioether group containing oxygen or sulfur such as an ethyleneoxy group or a thioethyleneoxy group; a lactone group such as butyrolactone; and a lactam group such as pyrrolidone.

Specific examples of the monomer, useful as the hydrophobic polar group containing nitride, sulfur or oxygen as the hetero atom for suitably producing a surface graft polymer in the invention, include 4-vinylpyridine, 2-vinylpyridine, N-vinylpyrrolidone, N,N-dimethylaminoethyl (meth)acrylate, N-morpholinoethyl(meth)acrylate, γ-butyrolactone (meth) acrylate, mevaloniclactone (meth) acrylate.

The substrate surface, on which a graft polymer chain exhibiting polarity is present, can be prepared in the same manner as described above, except that the hydrophilic monomer is replaced with the non-ionic polar monomer.

In the invention, there is no need for the graft polymer to cover the substrate surface entirely. When the graft polymer is introduced into the substrate surface at a proportion of 10% or more relative to the entire surface area, effective and improved adhesiveness is obtained. The graft polymer is introduced at a proportion of preferably 30% or more, and more preferably 60% or more relative to the entire surface area.

Support

As the support, preferably used is a film that exhibits mechanical strength and dimensional stability and also has transparency for improving the visibility by taking advantage of the transparency of the inorganic thin film. Specific examples of the film used in the invention include a polyester film, such as a polyethylene terephthalate film, a polyethylene terephthalate-based copolymer polyester film and a polyethylene naphthalate film; a polyamide film, such as a nylon 66 film, a nylon 6 film and a metaxylydenediamine copolymer polyamide film; a polyolefin film, such as a polypropylene film, a polyethylene film and an ethylene/propylene copolymer film; a polyimide film; a polyamide-imide film; a polyvinyl alcohol film; an ethylene/vinyl alcohol copolymer film; a polyphenylene film; a polysulfone film; and a polyphenylenesulfide film. Among these, a polyester film, such as a polyethylene terephthalate film, and a polyolefin film, such as a polyethylene film and a polypropylene film, are preferred from the standpoints of cost effectiveness, transparency and gas barrier properties. The film may be either oriented or not oriented, and may be used solely or as a laminate of plural layers each having different properties.

Various kinds of additives and stabilizers may be incorporated in or coated on the film, used as the support, insofar as they do not impair the effect of the invention. Examples of the additive for use in the invention include an antioxidant, an antistatic agent, an ultraviolet screening agent, a plasticizer, a lubricant and a heat stabilizer. Furthermore, the film may be subjected to surface treatment such as corona treatment, plasma treatment, glow discharge treatment, ion bombard treatment, chemical treatment, solvent treatment and surface roughening treatment.

The thickness of the substrate may be appropriately specified in consideration of suitability as a packaging material without any particular limitation, and in general, from the standpoint of practical use, it is preferably in a range from 3 μm to 1 mm, and more preferably from 10 μm to 300 μm from the standpoints of flexibility and workability for forming the inorganic thin film.

Inorganic Thin Film

Hereinafter, the inorganic thin film provided on the support will be described.

The inorganic material for forming the inorganic thin film used in the invention is not particularly limited insofar as it has gas barrier properties when formed into a thin film. Preferably a metal and a metallic oxide are used as the inorganic material.

As a method for forming the inorganic thin film by introducing the inorganic material into the hydrophilic surface having the hydrophilic graft polymer chain present on the support, conventionally known methods can be used for forming a film of the inorganic material. Among the methods, a gas phase depositing film-forming method (gas phase method) is preferred from the standpoints of uniformity and transparency of the film produced. Examples of the gas phase method include chemical vapor deposition methods (CVD), such as chemical deposition, and physical vapor deposition methods (PVD), such as vacuum vapor deposition and sputtering, and any of such methods can appropriately be used.

Examples of the inorganic material suitably used for the film formation by the gas phase method, such as vacuum vapor deposition and sputtering, include a metal, such as aluminum (Al), zinc (Zn), magnesium (Mg), nickel (Ni) and chromium (Cr), a metallic oxide, such as zinc oxide (ZnO), titanium oxide ($TiO_2$), aluminum oxide ($Al_2O_3$), magnesium oxide (MgO), tin oxide ($SnO_2$), indium oxide ($In_2O_3$) and ITO (indium tin oxide), and a silicon compound, such as silicon (Si), silicon monoxide (SiO) and silicon dioxide ($SiO_2$).

Silicon (Si), aluminum (Al), magnesium (Mg), tin (Sn) and indium (In) may be oxidized during the film formation to form an inorganic oxide thin film.

Among these inorganic materials, it is particularly preferred that aluminum (Al) is oxidized to form aluminum oxide ($Al_2O_3$) in consideration of the coloring tendency of the vapor-deposited film, the practically evaporating rate, the adhesiveness to the substrate, the oxygen barrier properties and the cost of the material.

Furthermore, as another method for forming the inorganic thin film by providing the inorganic material on the hydrophilic surface on which the hydrophilic graft polymer chain is present, a fine particle adsorption method is preferably applied to achieve high gas barrier properties.

The fine particle adsorption method as used herein refers to a method in which an ultra-fine powder (a powder of ultra-fine particles) is attracted to the polar group in the hydrophilic graft polymer chain, and the ultra-fine powder is fixed to the hydrophilic surface or brought into the interior of a layer containing the hydrophilic graft polymer chain that forms the hydrophilic surface. Because the hydrophilic graft polymer chain used in the invention has a polymer portion exerting high mobility, the ultra-fine powder is adsorbed not only to the polar group on the surface of the layer containing the hydrophilic graft polymer chain but also penetrates into the layer near the internal polar group, whereby a multi-layer is obtained that contains fine particles.

Examples of the fine particle adsorption method, for attaching the ultra-fine powder to the hydrophilic surface having the hydrophilic graft polymer chain present on the support, include a method in which a dispersion of the ultra-fine powder is coated and then dried, and a method in which the support having the hydrophilic surface is immersed in a dispersion of the ultra-fine powder and then removed therefrom. The latter method is effective for forming a uniform layer containing fine particles. When the immersion method is employed, the duration of immersion is preferably in a range from 2 seconds to 48 hours, more preferably in a range from 10 seconds to 12 hours, and further preferably in a range from 30 seconds to 10 hours.

Examples of the ultra-fine powder usable in the fine particle adsorption method include an ultra-fine powder of an inorganic compound, such as silicon oxide, zirconium oxide, titanium oxide, alumina, magnesium oxide and tin oxide, and a metal, such as aluminum, tin and zinc. The ultra-fine powder preferably has an average particle diameter of 100 nm or less, and more preferably 50 nm or less. The ultra-fine powder may be used singly as a sole material selected from the above inorganic compounds and the metals, or as a mixture of two or more thereof. If an insulating inorganic compound, such as silicon oxide, is used as the ultra-fine powder, insulating properties can be imparted to the gas barrier film entirely. Among the various kinds of ultra-fine powders described above, silicon oxide is preferred since it can readily be formed into a ultra-fine powder.

Employing the fine particle adsorption method described above, an inorganic thin film having a multi-layer construction densely containing the ultra-fine powder can be formed. As described later (in Example 3), a photograph taken through a scanning electron microscope (a cross sectional SEM) confirms that after the fine particle adsorption, the resultant graft layer is approximately twice as thick as the layer before the adsorption. Therefore, the inorganic thin film produced by the fine particle adsorption method can reduce gas permeability, owing to the ultra-fine powder contained abundantly in the layer, and exhibit excellent gas barrier properties.

The thickness of the inorganic thin film is not particularly limited. The thickness is preferably in a range from 10 to 1,000 nm, and more preferably in a range from 20 to 200 nm. When the thickness is less than 10 nm, the thin film becomes discontinuous to thus provide insufficient gas barrier properties. When it exceeds 1,000 nm, there arise problems in that the film is warped when the support is thin, the film is colored to become opaque, and the flexibility and the flexural resistance of the film are deteriorated.

The gas barrier film of the invention has a feature in that the inorganic thin film, which is formed on the support by the vacuum vapor deposition method or the fine particle adsorption method and hence possesses excellent gas barrier properties, is firmly and uniformly adhered to the surface of the support through the interaction between the inorganic thin film and the functional group in the hydrophilic graft chain by the function of the hydrophilic graft chain introduced into the support surface. Therefore, the gas barrier film of the invention exerts advantageous effects of good adhesion between the hydrophilic surface and the inorganic thin film, and excellent gas barrier properties.

The gas barrier film of the invention can be produced in a relatively simple manner. Since the inorganic thin film having excellent gas barrier properties exhibits good durability, the film can be advantageously used as a packaging material that is applicable for various purposes.

EXAMPLES

The invention will be described in more detail with reference to the following examples, but the invention is not construed as being limited thereto.

Examples 1 and 2, and Comparative Example 1

(Preparation of Support)

A biaxially oriented polyethylene terephthalate film (A4100, manufactured by Toyobo Co., Ltd.), used as a substrate and having a thickness of 188 μm, was subjected to an oxygen glow treatment using a planographic magnetron sputtering apparatus (CFS-10-EP70, manufactured by Shibaura Eletec Corp.) under the following conditions.

| <Conditions for Oxygen Glow Treatment> | |
| --- | --- |
| Initial vacuum: | $1.2 \times 10^{-3}$ Pa |
| Oxygen pressure: | 0.9 Pa |
| RF glow: | 1.5 kW |
| Treating time: | 60 sec |

(Introduction of Graft Polymer)

The resultant film, which had been subjected to the glow treatment, was immersed in a nitrogen-bubbled aqueous solution of sodium styrenesulfonate (10 wt %) at 70° C. for 7 hours. After the immersion, the film was washed with water for 8 hours to prepare a support (support A) in which sodium styrenesulfonate was graft-polymerized on the surface thereof.

The same procedures were repeated, except that sodium styrenesulfonate was replaced with acrylic acid, to prepare a support (support B) in which acrylic acid was graft-polymerized on the surface thereof. Further, an additional support in which a graft polymer was not introduced was prepared (support R).

(Formation of Inorganic Thin Film by Gas Phase Method)

An aluminum oxide film was formed by sputtering on the resulting support A to thereby produce a gas barrier film A of Example 1.

In more detail, the support A was placed in a sputtering apparatus, and after evacuating to 1.3 mPa, a mixed gas (argon/oxygen in a ratio of 98.5/1.5 by volume) was introduced thereto. The atmospheric pressure was adjusted to 0.27 Pa, and DC sputtering was carried out by controlling a temperature of the support A to 50° C. and applying an electric power of 1 W/cm$^2$. The formed inorganic thin film had a thickness of 50 nm.

Using support B and support R, the same sputtering procedure as applied to support A was repeated to produce a gas barrier film B of Example 2 and a gas barrier film R of Comparative Example 1.

Evaluation of Performance of Gas Barrier Film (Oxygen Permeability)

The oxygen permeability was measured using a measuring apparatus (Model OX-TRAN 100T WIN, manufactured by MOCON, Inc.) at a temperature of 25° C. and a relative humidity of 90%. When the oxygen permeability less than 1.0 cc/m$^2$·24 hr was obtained, the gas barrier film was rated practically sufficient in oxygen barrier properties.

(Water Vapor Permeability)

The water vapor permeability was measured according to the testing method (cup method) standardized by JIS Z0208 under the conditions of temperature of 40° C. and relative humidity of 90%. When the water vapor permeability less than 1.0 g/m$^2$·24 hr was obtained, the gas barrier film was rated practically sufficient in water vapor barrier properties.

The gas barrier film A had an oxygen permeability of 0.3 cc/m$^2$·24 hr and a water vapor permeability of 0.4 g/m$^2$·24 hr, indicating that both of the oxygen barrier properties and the water vapor barrier properties were good.

The gas barrier film B had an oxygen permeability of 0.2 cc/m$^2$·24 hr and a water vapor permeability of 0.8 g/m$^2$·24 hr, indicating that both of the oxygen barrier properties and the water vapor barrier properties were good. The gas barrier film R had an oxygen permeability of 0.6 cc/m$^2$·24 hr and a water vapor permeability of 1.0 g/m$^2$·24 hr.

(Evaluation of Film Adhesion)

The gas barrier films A and B were evaluated for film adhesion according to the grid tape method standardized by JIS 5400. The surface of the film was cut into a grid form and then subjected to a peeling test using an adhesive tape. None of grid pieces were peeled off through the test, revealing that the films had excellent adhesion.

(Evaluation of Transparency)

The gas barrier films were evaluated for light transmittance, to be used as an index for evaluating transparency, at a wavelength of 550 nm with the air as the reference using an ultraviolet and visible light spectrophotometer (UV2400-PC, manufactured by Shimadzu Corp.). The gas barrier film A had a light transmittance of 85% or more, and the gas barrier film B had a light transmittance of 90% or more. Therefore, both of the films were found to have excellent transmittance with respect to visible light and hence exhibit high transparency.

From the results of Examples 1 and 2, the gas barrier films of Examples were confirmed to have excellent oxygen barrier properties, water vapor barrier properties and good adhesion of the inorganic thin film adhered to the surface. Furthermore, the gas barrier films of Examples 1 and 2 exhibited high transparency that was suitable enough for practical uses.

Example 3

(Formation of Inorganic Thin Film by Fine Particle Adsorption Method)

Support B was immersed in a dispersion of aluminum oxide ultra-fine powder ($Al_2O_3$, 15 wt % aqueous dispersion, manufactured by C.I. Kasei Co., Ltd.) for 5 hours. After the immersion, support A was removed therefrom and washed with water to produce a gas barrier film C of Example 3 having an inorganic thin film formed thereon.

Evaluation of Performance of Gas Barrier Film

The produced gas barrier film C was measured for oxygen permeability and water vapor permeability in the same manner as in Examples 1 and 2 to evaluate the performance of the produced gas barrier films. The results are shown below.

The gas barrier film C had an oxygen permeability of 0.25 cc/m$^2$·24 hr and a water vapor permeability of 0.3 g/m$^2$·24 hr, indicating that both of the oxygen barrier properties and the water vapor barrier properties were good.

(Evaluation of Film Adhesion)

The gas barrier film C was evaluated for film adhesion according to the grid tape method standardized by JIS 5400 in the same manner as in Examples 1 and 2. The surface of the film was cut into a grid form and then subjected to a peeling test using an adhesive tape. None of grid pieces were peeled off through the test, confirming that the films had excellent adhesion.

(Observation of Shape of Inorganic Thin Film)

The produced gas barrier film C was assessed for the shape of the inorganic thin film through a surface SEM and a cross sectional SEM using a scanning electron microscope (JEOL S800, manufactured by JEOL Ltd.). The results obtained by a surface SEM revealed that fine particles having a diameter of 10 to 50 nm were abundantly contained therein. A cross sectional SEM also revealed that about five layers containing fine particles were laminated. Incidentally, the thickness of the graft layer of film C after the inorganic thin film formation was 0.24 μm. The thickness of the graft layer before the fine particle adsorption was 0.12 μm, and hence it was confirmed that the thickness of the layer increased by carrying out the fine particle adsorption.

From the results of Example 3, it was confirmed that the gas barrier films of Examples produced by the fine particle adsorption method had excellent oxygen barrier properties and water vapor barrier properties and exhibited good adhesion of the inorganic thin film adhered to the surface. It was also found that the gas barrier films of Example 3 included an inorganic thin film having plural layers containing fine particles.

Examples 4 and 5

(Preparation of Support Including a Surface to which Graft Polymer Chain is Bonded)

A biaxially oriented polyethylene terephthalate film (A4100, manufactured by Toyobo Co., Ltd.), used as a substrate and having a thickness of 188 μm, was subjected to an oxygen glow treatment using a planographic magnetron sputtering apparatus (CFS-10-EP70, manufactured by Shibaura Eletec Corp.) under the following conditions.

| <Conditions for Oxygen Glow Treatment> | |
|---|---|
| Initial vacuum: | $1.2 \times 10^{-3}$ Pa |
| Oxygen pressure: | 0.9 Pa |
| RF glow: | 1.5 kW |
| Treating time: | 60 sec |

(Introduction of Graft Polymer)

The resulting film, which had been subjected to the aforementioned treatment, was immersed in a toluene solution of 5-(trichlorosilylpentyl)2-bromo-2-methylpropionate (polymerization initiator at the terminal end: silane coupling agent) (1 wt %) under argon at room temperature. After the immersion of overnight, the film was removed therefrom and washed with toluene and methanol to prepare a polypropylene film to which the initiator was fixed at the surface. Incidentally, 5-(trichlorosilylpentyl)2-bromo-2-methylpropionate was synthesized according to the method described in "Macromolecules" written by C. J. Hawker et al, 1999, Vol. 32, pp. 1424.

Then, 47.7 g of 4-vinylpyridine, 1.0 g of tris(2-dimethylaminoethyl)amine and 0.646 g of coprous bromide were dissolved in 100 ml of isopropanol, and the solution was subjected to argon aeration for 15 minutes. In the resultant solution after evacuation, the film to which the initiator had been fixed was immersed at room temperature for one hour. After the immersion, the film was removed therefrom, washed with water and methanol, and subjected to surface rubbing for cleaning using a cloth (bemcotton) containing methanol.

The prepared support (support D) was assessed by ellipsometry using VB-250 (manufactured by J. A. Woollam Corp.) to confirm that 4-vinylpilidine was graft-polymerized to form a layer of 10 nm thick.

The same procedures were repeated, except that 4-vinylpyridine was replaced with 2-vinylpyridine, to prepare a support (support E) in which 2-pinylpyridine was graft-polymerized on the surface thereof.

(Formation of Inorganic Thin Film)

An aluminum oxide film was formed by sputtering on the resulting support D to thereby produce a gas barrier film D of Example 4.

In more detail, support D was placed in a sputtering apparatus, and after evacuating to 1.3 mPa, a mixed gas (argon/oxygen in a ratio of 98.5/1.5 by volume) was introduced thereto. The atmospheric pressure was adjusted to 0.27 Pa, and DC sputtering was carried out by controlling a temperature of the support E to 50° C. and applying an electric power of 1 W/cm$^2$. The formed inorganic thin film had a thickness of 50 nm. Using support E, the same sputtering procedure as applied to support D was repeated to produce a gas barrier film E of Example 5.

Evaluation of Performance of Gas Barrier Film (Oxygen Permeability)

The oxygen permeability was measured using a measuring apparatus (Model OX-TRAN 100T WIN, manufactured by MOCON, Inc.) at a temperature of 25° C. and a relative humidity of 90%. When the oxygen permeability less than 1.0 cc/m$^2$·24 hr was obtained, the gas barrier film was rated practically sufficient in oxygen barrier properties.

(Water Vapor Permeability)

The water vapor permeability was measured according to the testing method (cup method) standardized by JIS Z0208 under the conditions of temperature of 40° C. and relative humidity of 90%. When the water vapor permeability less than 1.0 g/m$^2$·24 hr was obtained, the gas barrier film was rated practically sufficient in water vapor barrier properties.

The gas barrier film D had an oxygen permeability of 0.25 cc/m$^2$·24 hr and a water vapor permeability of 0.36 g/m$^2$·24 hr, indicating that both of the oxygen barrier properties and the water vapor barrier properties were good.

The gas barrier film E had an oxygen permeability of 0.21 cc/m$^2$·24 hr and a water vapor permeability of 0.55 cc/m$^2$·24 hr, indicating that both of the oxygen barrier properties and the water vapor barrier properties were good.

As described above, the present invention provides the gas barrier film that exhibits good and long-lasting adhesion between the film and the inorganic thin film, and moreover is excellent in transparency, visibility and gas barrier properties.

What is claimed is:

1. A method of producing a gas barrier film comprising the steps of: preparing a substrate made of polyester; allowing the substrate to react with a hydrophilic polymer selected from the group consisting of polyacrylic acid, polymethacrylic acid, polystyrene sulfonic acid, poly-2-acrylamide-2-methylpropane sulfonic acid and salts thereof, polyacrylamide, and polyvinyl acetamide, the hydrophilic polymer having at a terminal end or in a side chain thereof a functional group that is capable of reacting with the substrate to form a hydrophilic graft polymer layer; and forming an inorganic thin film on the formed hydrophilic graft polymer layer by a gas phase method using an inorganic compound or by an inorganic fine particle adsorption method, wherein the functional group is selected from the group consisting of a silane coupling group, an isocyanate group, an amino group, a hydroxyl group, a carboxyl group, a sulfonic acid group, a phosphoric acid group, and an epoxy group.

2. A method of producing a gas barrier film according to claim 1, wherein the gas phase method is selected from the group consisting of chemical vapor deposition, vacuum deposition and sputtering.

3. A method of producing a gas barrier film according to claim 1, wherein an inorganic material of the inorganic thin film is selected from the group consisting of aluminum (Al), zinc (Zn), magnesium (Mg), nickel (Ni), chromium (Cr), zinc oxide (ZnO), titanium oxide (TiO$_2$), aluminum oxide (Al$_2$O$_3$), magnesium oxide (MgO), tin oxide (SnO$_2$), indium oxide (In$_2$O$_3$), indium tin oxide (ITO), silicon (Si), silicon monoxide (SiO) and silicon dioxide (SiO$_2$).

4. A method of producing a gas barrier film according to claim 1, wherein the inorganic thin film has a thickness of 10 to 1,000 nm.

5. A method of producing a gas barrier film comprising the steps of:
preparing a substrate made of polyester;
applying energy to the surface of the substrate by plasma irradiation, light irradiation or heating to provide active species on the surface of the substrate;
allowing the substrate having the active species on the surface thereof to react with a compound having a hydrophilic functional group and a double bond in a molecule, to polymerize the compound from a starting point on the substrate to thereby form a hydrophilic graft polymer layer; and forming an inorganic thin film on the formed hydrophilic graft polymer layer by a gas phase method using an inorganic compound or by an inorganic fine particle adsorption method, wherein the hydrophilic functional group is selected from the group consisting of an ammonium group, a phosphonium group, a sulfonic acid group, a carboxyl group, a phosphoric acid group and a phosphonic acid group.

6. A method of producing a gas barrier film according to claim 5, wherein the gas phase method is selected from the group consisting of chemical vapor deposition, vacuum deposition and sputtering.

7. A method of producing a gas barrier film according to claim 5, wherein an inorganic material of the inorganic thin film is selected from the group consisting of aluminum (Al), zinc (Zn), magnesium (Mg), nickel (Ni), chromium (Cr), zinc oxide (ZnO), titanium oxide ($TiO_2$), aluminum oxide ($Al_2O_3$), magnesium oxide (MgO), tin oxide ($SnO_2$), indium oxide ($In_2O_3$), indium tin oxide (ITO), silicon (Si), silicon monoxide (SiO) and silicon dioxide ($SiO_2$).

8. A method of producing a gas barrier film according to claim 5, wherein the inorganic thin film has a thickness of 10 to 1,000 nm.

* * * * *